(12) United States Patent
Pirillis et al.

(10) Patent No.: US 7,355,857 B2
(45) Date of Patent: Apr. 8, 2008

(54) HEAT SINK GASKET

(75) Inventors: Alexandros Pirillis, Skokie, IL (US); Joseph R. Llorens, Winfield, IL (US)

(73) Assignee: Methode Electronics, Inc., Chicago, IL (US)

( * ) Notice: Subject to any disclaimer, the term of this patent is extended or adjusted under 35 U.S.C. 154(b) by 116 days.

(21) Appl. No.: 11/348,647

(22) Filed: Feb. 7, 2006

(65) Prior Publication Data

US 2007/0183128 A1    Aug. 9, 2007

(51) Int. Cl.
*H05K 7/20* (2006.01)

(52) U.S. Cl. .................. 361/715; 361/704; 361/707; 361/724; 361/816; 361/818; 361/689; 361/699; 257/712; 257/718; 257/E23.086; 174/16.1; 174/378; 174/383; 174/16.3; 174/32; 174/351; 174/350; 174/358; 439/76.1; 439/924.1; 165/80.3; 165/80.4

(58) Field of Classification Search .............. 361/704, 361/707, 715, 816, 818, 689, 699, 724; 174/16.1, 174/16.3, 32, 350, 351, 378, 383, 358; 257/712, 257/718, E23.086; 439/76.1, 924.1; 165/80.3, 165/80.4

See application file for complete search history.

(56) References Cited

U.S. PATENT DOCUMENTS

| | | | |
|---|---|---|---|
| 4,061,413 A | 12/1977 | Keller | |
| 4,678,716 A | 7/1987 | Tzeng | |
| 4,945,633 A * | 8/1990 | Hakanen et al. | 29/825 |
| 5,030,793 A | 7/1991 | McCarthy | |
| 5,187,621 A * | 2/1993 | Tacklind | 360/97.02 |
| 5,241,453 A * | 8/1993 | Bright et al. | 361/704 |
| 5,252,782 A * | 10/1993 | Cantrell et al. | 174/387 |
| 5,280,191 A * | 1/1994 | Chang | 257/712 |
| 5,311,408 A | 5/1994 | Ferchau et al. | |
| 5,381,314 A | 1/1995 | Rudy, Jr. et al. | |
| 5,412,340 A * | 5/1995 | Tanikoshi | 330/68 |
| 5,416,668 A * | 5/1995 | Benzoni | 361/816 |
| 5,483,423 A | 1/1996 | Lewis et al. | |
| 5,566,052 A | 10/1996 | Hughes | |
| 5,703,754 A | 12/1997 | Hinze | |
| 5,731,541 A * | 3/1998 | Bernd et al. | 174/387 |
| 5,761,042 A | 6/1998 | Widmayer et al. | |
| 5,804,875 A * | 9/1998 | Remsburg et al. | 257/718 |
| 5,880,930 A | 3/1999 | Wheaton | |
| 5,947,753 A | 9/1999 | Chapman et al. | |

(Continued)

OTHER PUBLICATIONS

Laird Technologies, "Mold-In-Place Printed Circuit Board Shielding", Elastomeric EMI Sheilding Solutions, Oct. 2002, cover, 42 and back pg.

(Continued)

*Primary Examiner*—Courtney L Smith
(74) *Attorney, Agent, or Firm*—Seyfarth Shaw LLP

(57) ABSTRACT

A receptacle assembly is provided having a gasket interposed between a heat sink and the receptacle, in order to provide EMI shielding and limit leakage from an opening in the receptacle that allows the heat sink to engage an electronic module inserted in the receptacle cavity. The heat sink may have a groove in which the gasket is mounted and upon mounting the heat sink to the receptacle, the gasket surrounds the opening in the receptacle and provides a resilient shield to maintain a seal during movement of the heat sink due to insertion of the electronic module within the receptacle.

20 Claims, 3 Drawing Sheets

U.S. PATENT DOCUMENTS

| | | | |
|---|---|---|---|
| 5,982,620 A * | 11/1999 | Lin | 361/704 |
| 6,023,415 A | 2/2000 | Mayer et al. | |
| 6,058,014 A | 5/2000 | Choudhury et al. | |
| 6,065,530 A | 5/2000 | Austin et al. | |
| 6,116,924 A | 9/2000 | Laut | |
| 6,128,194 A | 10/2000 | Francis | |
| 6,137,051 A | 10/2000 | Bundza | |
| 6,178,318 B1 | 1/2001 | Holmberg et al. | |
| 6,198,630 B1 | 3/2001 | Cromwell | |
| 6,201,704 B1 | 3/2001 | Poplawski et al. | |
| 6,219,239 B1 | 4/2001 | Mellberg et al. | |
| 6,220,873 B1 * | 4/2001 | Samela et al. | 439/76.1 |
| 6,243,265 B1 | 6/2001 | Wong et al. | |
| 6,330,745 B1 | 12/2001 | Cromwell et al. | |
| 6,392,900 B1 | 5/2002 | Petty et al. | |
| 6,445,583 B1 * | 9/2002 | Kline et al. | 361/704 |
| 6,515,861 B1 | 2/2003 | Andric et al. | |
| 6,577,504 B1 | 6/2003 | Lafland et al. | |
| 6,624,432 B1 * | 9/2003 | Gabower et al. | 250/515.1 |
| 6,749,448 B2 | 6/2004 | Bright et al. | |
| 6,752,663 B2 | 6/2004 | Bright et al. | |
| 6,816,376 B2 * | 11/2004 | Bright et al. | 361/704 |
| 6,884,937 B1 | 4/2005 | Mistry et al. | |
| 6,892,796 B1 * | 5/2005 | Nagashima et al. | 165/80.4 |
| 6,935,882 B2 | 8/2005 | Hanley et al. | |
| 6,944,025 B2 | 9/2005 | Hockonson et al. | |
| 6,980,437 B2 * | 12/2005 | Bright | 361/704 |
| 7,168,971 B2 * | 1/2007 | Manson et al. | 439/271 |
| 2002/0135983 A1 * | 9/2002 | Freitas et al. | 361/704 |
| 2005/0190540 A1 * | 9/2005 | Shearman et al. | 361/715 |
| 2005/0195565 A1 | 9/2005 | Bright | |
| 2006/0012969 A1 * | 1/2006 | Bachman | 361/816 |
| 2006/0279937 A1 * | 12/2006 | Manson et al. | 361/724 |

OTHER PUBLICATIONS

David A. Case and Michael J. Oliver, Compliance Engineering, "A Method for Evaluating EMI/RFI Gasket Material in PCMCIA Cards", Nov. 27, 2005, pp. 1-7.

XFP Promoters, "XFP (10 Gigabit Small Form Factor Pluggable Module)", Revision 3.1, Apr. 2, 2003, pp. i-xv, 1-160.

* cited by examiner

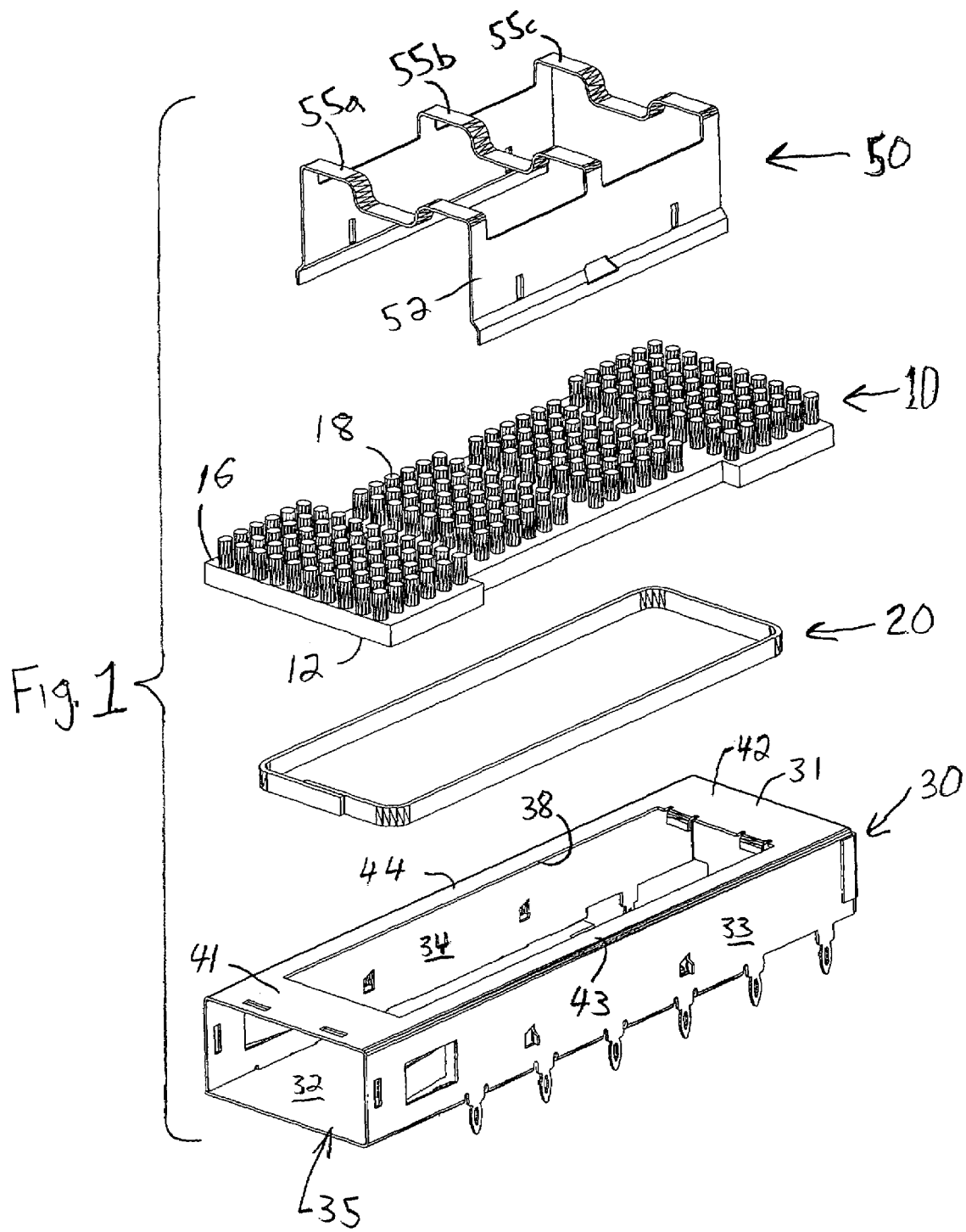

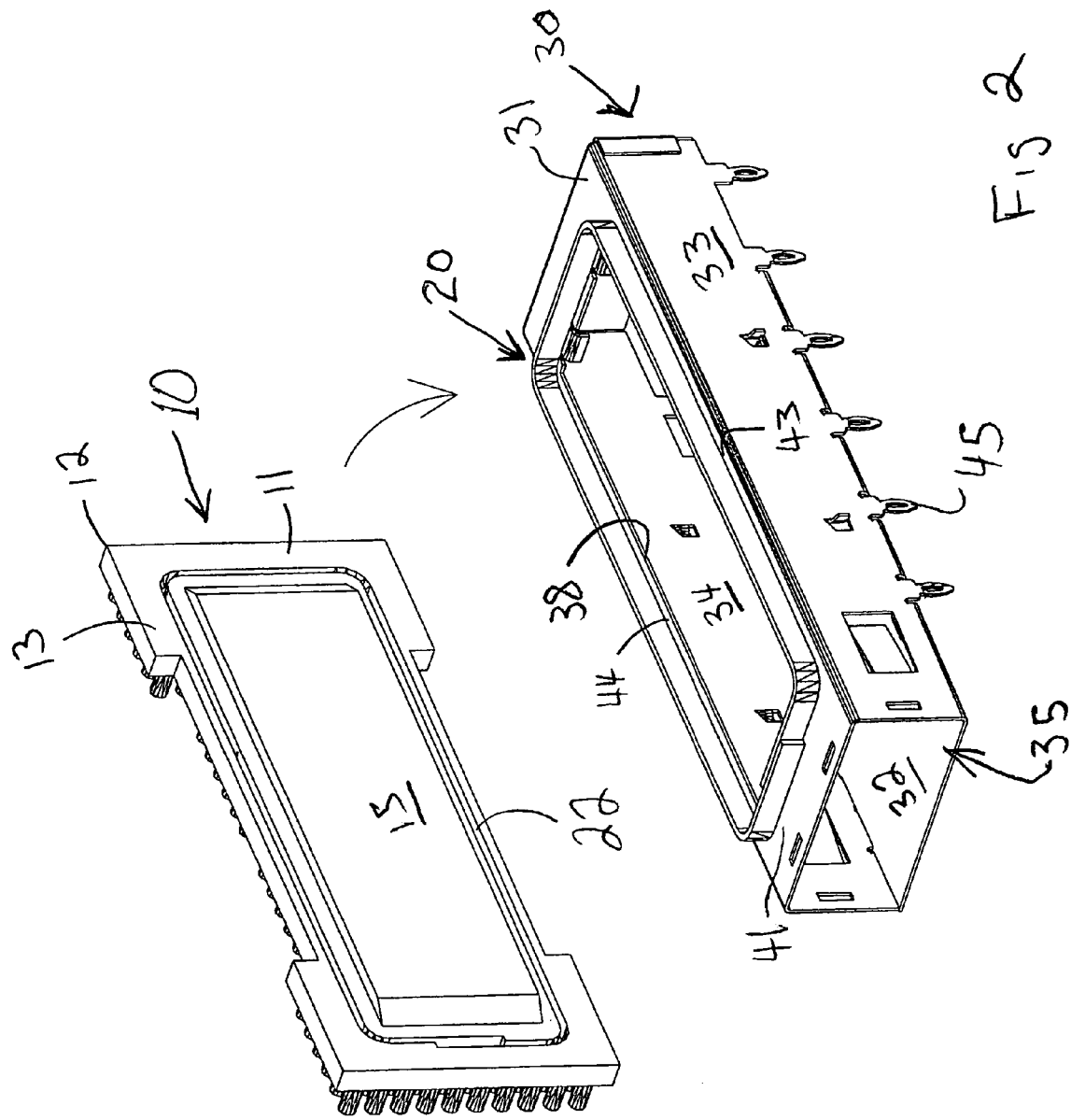

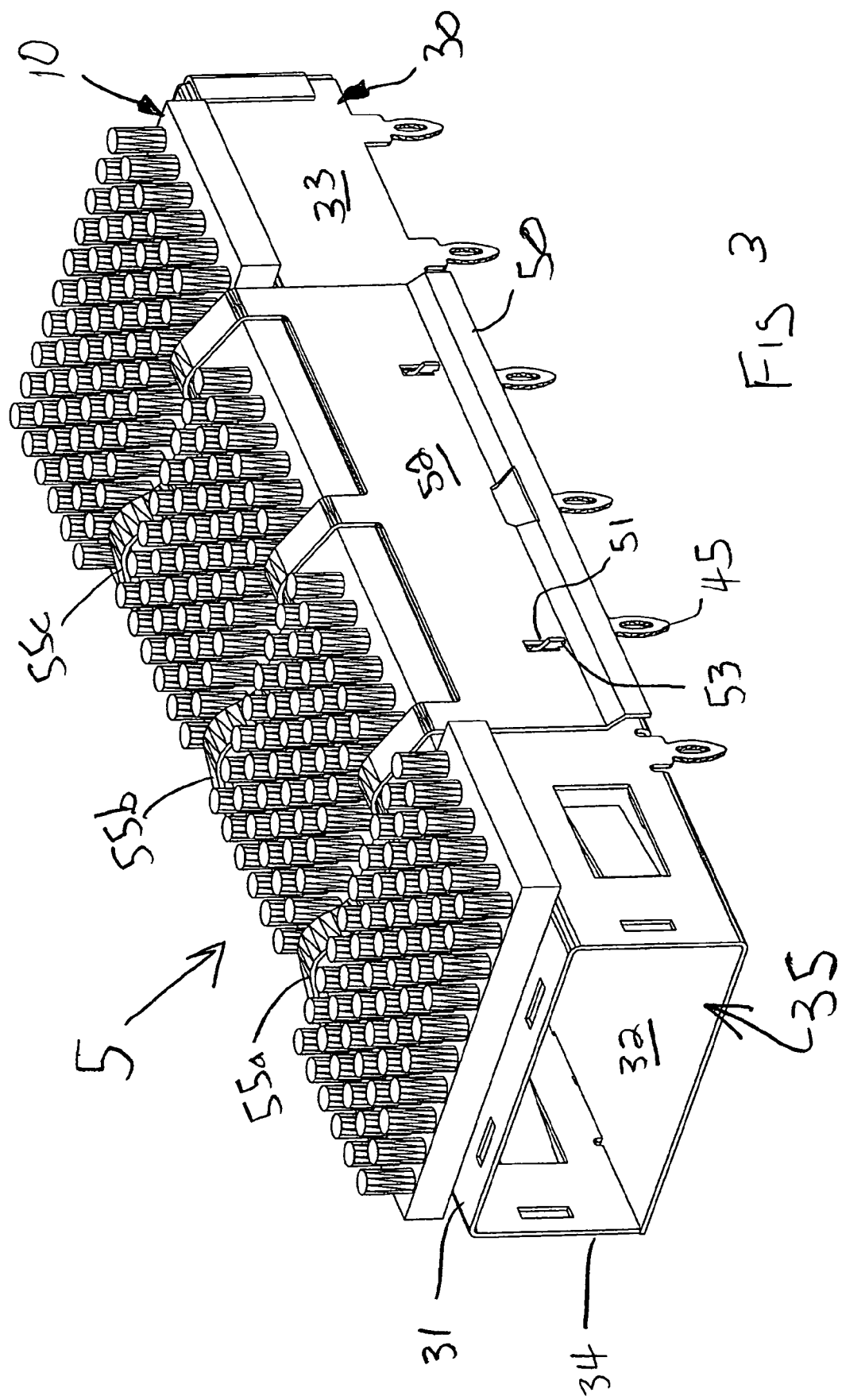

HEAT SINK GASKET

BACKGROUND

The invention relates generally to a receptacle assembly including a heat sink having a gasket for sealing the assembly.

Receptacles for electronic devices are well known that receive electronic modules, such as transceiver modules which are insertable into the receptacle. Such electronic modules may transmit data at high speeds including rates up to 10.0 gigabits per second (Gbps). Such data transmission is accomplished by circuitry which generate high levels of electromagnetic energy at short wavelengths and produce electromagnetic interference (EMI). Such electronic modules also generate large amounts of heat in order to provide data transmission at these high rates. Thus, it is common to incorporate a heat sink with the receptacle in order to help reduce temperatures of heat generating components.

An example of such an electronic module is a small form factor pluggable (XFP) module which is pluggable into a receptacle or XFP cage. Such a module is well know and is described in a standardized publication entitled "Ten Gigabit Small Form Factor Pluggable Module" by the XFP promoters ("XFP specification"). The XFP specification requires a cage having a large opening in the top surface and a heat sink mounted over the opening. Upon insertion of the XFP module into the cage, its upper surface becomes exposed through the opening in the top of the cage and abuts against the heat sink in order to transfer the heat from the transceiver module to the heat sink.

While the XFP specification discloses the orientation of the heat sink over the opening in the top of the cage, it does not address some of the operational issues that arise due to such an arrangement. For example, the large opening in the top of the cage provides a large area where electromagnetic energy may escape and produce EMI that could affect adjacent components such as other electronic modules or circuitry. Therefore, there is desired a receptacle assembly which provides for a means of shielding the EMI that can escape the receptacle opening.

SUMMARY

The present invention provides for a receptacle assembly comprising a receptacle formed by walls joined to form an interior cavity configured to receive an electronic module, one of the walls having an opening therethrough, a heat sink mounted over the opening, the heat sink having an abutment surface located adjacent the opening and the abutment surface of the heat sink being configured to physically contact the receptacle and a gasket surrounding the opening and disposed between the receptacle and the heat sink adjacent the abutment surface in order to reduce leakage of radiation from the opening. In an embodiment, the heat sink may include a groove formed around its perimeter and the gasket mounted in the groove. In an embodiment, the gasket may be a thin rectangular shaped strand of electrically conductive elastomer. In an embodiment, the opening may be in a top wall of the receptacle and a receptacle bottom wall includes pins for mounting to a circuit board.

In an embodiment, when the module is inserted an engagement surface of the heat sink rests within the interior cavity of the receptacle at a level that interferes with an installation path of electronic module and the heat sink is movable outward by the module and the gasket expands to maintain a seal between the heat sink and the receptacle. In an embodiment, a bottom surface of the heat sink may be stepped to extend into the interior cavity of the receptacle. In an embodiment, the heat sink may include a perimeter surface surrounding the abutment surface, the perimeter being recessed with respect to a plane containing the bottom surface and the perimeter containing a groove for receiving the gasket.

In an embodiment, the opening may be provided in a top wall and the wall may include front, rear and opposed lateral portions that define a flat surface that support the gasket and the heat sink when mounted on the receptacle. In an embodiment, the gasket may be formed of a flexible material. In an embodiment, the receptacle may further comprise a clip provided over the heat sink, the clip securely engaging the receptacle to retain the heat sink upon the receptacle and causing the gasket to compress between the receptacle and the heat sink, so that the abutment surface may contact the perimeter of the receptacle.

In a further embodiment, the invention provides a receptacle assembly comprising a receptacle having walls to form an interior cavity configured to receive a pluggable module, one of the walls having an opening therethrough, a covering component mounted over the opening, the covering component having an abutment surface located proximate the receptacle and a gap formed between the abutment surface and the receptacle and a gasket disposed in the gap in order to seal the gap and prevent radiation from escaping from the opening. In an embodiment, the opening may be surrounded by a front, rear and opposed lateral portions defining a flat surface and the gasket disposed around the opening upon the flat surface.

In an embodiment, the abutment surface of the covering component may provide a perimeter surface including a groove for receiving the gasket. In an embodiment, the gasket may be retained within the groove with an adhesive. In an embodiment, the receptacle assembly may further comprise a clip having a spring arm and wherein the covering component is a heat sink and the clip is secured over the heat sink, the spring arm flexing to permit the heat sink to move outward away from the receptacle and when a pluggable module is inserted, the clip having side rails that snap over the side walls of the receptacle. In an embodiment, an abutment surface of the covering component is flat and smooth to abut a flat surface of the receptacle. In an embodiment, when the pluggable module is removed, an engagement surface of the covering component rests within the interior cavity of the receptacle at a level that interferes within installation path of the pluggable module, the covering component being movable outward by the pluggable module when the pluggable module is installed and the gasket expanding to maintain a seal in the gap.

In a further embodiment, the invention provides for a heat sink for mounting to a Faraday cage, the heat sink comprising an upper portion for dissipating heat, a lower portion having an abutment surface formed at least around an outer perimeter of the lower portion, a groove formed in the outer perimeter, a gasket mounted in the groove and the gasket for sealing a gap formed between the abutment surface and the Faraday cage to which the heat sink is mounted. In an embodiment, the abutment surface may form a first flat surface for abutting a second flat surface of the Faraday cage and the gasket is interposed between the first and second flat surfaces. In an embodiment, the Faraday cage may include an opening and the gasket surrounds the opening.

BRIEF DESCRIPTION OF THE DRAWINGS

For the purpose of facilitating an understanding of the subject matter sought to be protected, there are illustrated in the accompanying drawings embodiments thereof, from an inspection of which, when considered in connection with the following description, the subject matter sought to be protected, its constructions and operation, and many of its advantages should be readily understood and appreciated.

FIG. 1 is an exploded perspective view of the receptacle assembly of the present invention;

FIG. 2 is a perspective view of the partially assembled receptacle assembly of FIG. 1, showing the underside of the heat sink; and FIG. 3 is a perspective view of the completely assembled receptacle assembly of FIG. 1.

DETAILED DESCRIPTION

An embodiment of the invention is depicted with respect to FIGS. 1-3. The receptacle assembly 5 includes a heat sink 10 including an abutment surface 11 formed on its bottom side (as depicted in FIG. 2). The bottom or lower portion 12 forms a perimeter 13 surrounding an engagement surface 15 which is stepped with respect to the outer perimeter portion 13. Opposite the lower portion 12 is an upper portion 16 which includes heat dissipating members 18 such as are well known in the art for increasing surface area to be exposed to the air for cooling purposes.

The receptacle assembly 5 includes a gasket 20 which, in a preferred embodiment, is a pliable conductive material. As shown in FIGS. 1-2, the gasket 20 is a thin rectangular shaped strand of electrically conductive elastomer. In an embodiment, TPSiV™ may be used. The heat sink 10 includes a groove 22 (FIG. 2) for receiving the gasket 20 therein. In an embodiment, the depth of the groove 22 is equal to approximately one-half (½) the height of the gasket, so that when the gasket 20 is received within the groove 22, it extends outward beyond a plane formed by the abutment surface 11. As is depicted in FIG. 2, the groove 22 is formed in a shape corresponding to the shape of the gasket 20. Although a rectangular shape of the gasket 20 and groove 22 are depicted in FIG. 2, other shaped gaskets and corresponding grooves may be provided such as other polygonal shapes or circular or spherical shapes that will help to seal the receptacle assembly 5. In the preferred embodiment, as shown in FIGS. 1 and 2, the gasket 20 is discontinuous. In an alternate embodiment, the gasket 20 may be continuous, multi-segmented or serrated.

The heat sink 10 provides a covering component for the receptacle 30. In an embodiment, the receptacle 30 is a Faraday cage formed of stamped metal having a top wall 31, bottom wall 32, and side walls 33, 34. The walls 31, 32, 33, 34 form an interior cavity 35 into which an electronic module (not shown) may be inserted. The receptacle 30 includes an opening 38 formed in its top wall 31. The top wall 31 includes a front portion 41, rear portion 42, and opposed lateral portions 43, 44. The front, rear, and opposed lateral portions 41, 42, 43, 44 provide for a flat metallic surface which abuts against the abutment surface 11 of the heat sink 10 when it is mounted to the receptacle 30 and encloses the opening 38. Thus, it is understood that the perimeter portion 13 of the heat sink 10 provides a first flat metallic surface that abuts against the front, rear, and opposed lateral portions 41, 42, 43, 44 that define a second flat metallic surface on the receptacle 30.

The receptacle 30 also includes pins 45 disposed around the perimeter of the receptacle 30. The pins allow for the mounting of the receptacle to a printed circuit board (not shown). The pins 45 are formed and protrude from the bottom wall 32 of the receptacle 30. In an alternate embodiment, the opening 38 may be formed in the bottom wall 32 or side walls 33, 34.

A clip 50 is provided which helps to retain the heat sink 10 on the receptacle 30. The clip 50 includes side rails 52 having apertures 51 for receiving latch fingers 53 protruding from the receptacle in order to latch the clip 50 onto the receptacle 30. The clip 50 includes spring arms 55a, b, c which overlie the heat sink 10. The spring arms are formed so that they are flexible.

As shown in FIG. 3, the assembled receptacle assembly 5 allows for an electronic module to be inserted to and removed from the cavity 35 of the receptacle 30. Upon insertion of a receptacle module into the cavity 35, the upper portion of the electronic module will engage the engagement surface 15 protruding downward from the heat sink 10 through the opening 38. The action of the electronic module sliding against the engagement surface will cause the heat sink 10 to move upward away from the top wall 31 of the receptacle 30. For example, prior to insertion of the electronic module, the engagement surface 15 forms a plane extending through the interior 35 of the receptacle 30. The insertion path of the electronic module through the cavity intersects the plane and causes the engagement surface 15 to be pushed upward. Therefore, due to the insertion of the electronic module, the perimeter 13 and abutment surface 11 of the heat sink will move away from the front, rear, and opposed lateral portions 41, 42, 43, 44 of the receptacle and form a gap between the receptacle and heat sink 10. Due to the resilient properties of the gasket 20, it will expand and fill the gap.

After complete insertion of the electronic module into the receptacle and upon powering up of the module, the gasket 20 will act to provide a seal between the top wall 31 of the receptacle 30 and the abutment surface 11 of the heat sink 10. Therefore, any radiation that attempts to escape through the opening 38 will be blocked by the gasket 20, so that it cannot radiate out of the gap formed between the heat sink 10 and the receptacle top wall 31 when the electronic module is inserted in the cavity 35 of the receptacle 30. In an embodiment, the spring arms 55a, b, c of the clip 50 provide downward pressure on the heat sink and in turn on the gasket 20 in order to compress the gasket against the top wall 31 of the receptacle 30.

Thus, it is understood that when an electronic module is inserted within the interior 35, the receptacle 30, the top of the module will interfere with the engagement surface 15 of the heat sink that lies within the interior cavity 35 in that the installation path of the electronic module will be at the same level as the engagement surface 15. Due to the flexible mounting of the heat sink 10 to the receptacle via the spring arms 55a, b, c, the heat sink is movable outward by the electronic module when it is installed within the receptacle and the gasket 20 will expand in order to maintain a seal between the heat sink 10 and the receptacle 30. In particular, the gasket maintains a seal between the perimeter 13, abutment surface 11, and the front, rear, and opposed lateral portions 41, 42, 43, 44 of the top wall 31 of the receptacle 30 in order to reduce EMI.

FIG. 2 depicts the gasket 20 placed on the top wall 31 of the receptacle 30 prior to placement of the heat sink 10 over the opening 38. However, in a preferred embodiment, the gasket 20 is first mounted within the groove 22 of the heat sink 10. Second, the heat sink 10 and gasket 20 are then mounted onto the receptacle 30 so that the engagement surface 15 is aligned within the opening 38 and the gasket 20 is aligned to surround the opening 38. Due to the stepped engagement surface 15, it acts to orient the heat sink 10 properly over the receptacle 30 so that the gasket 20 surrounds the opening 38. In an alternate embodiment, alignment members may be provided by the heat sink 10 lower portion 11 or gasket 20 in order to engage corresponding alignment members on the receptacle 30 to insure that the gasket 20 surrounds the opening 38 when the assembly 5 is complete. In an embodiment, the final assembly step is to attach the clip 50 over the heat sink 10 and receptacle 30. In an embodiment, the gasket 20 is maintained in the groove 22 due to a friction fit. However, other means of maintaining the gasket 20 within the groove 22 may include adhesive or fasteners. In an alternate embodiment, the heat sink 10 may have no groove and the gasket 20 may be mounted to the abutment surface 11 via adhesive, fasteners or welding.

The matter set forth in the foregoing description and accompanying drawings is offered by way of illustration only and not as a limitation. While particular embodiments have been shown and described, it will be obvious to those skilled in the art that changes and modifications may be made without departing from the broader aspects of applicants' contribution. For example, covering components, other than a heat sink and cages other than transceiver receptacles may be shielded by the gasket of the present invention. The actual scope of the protection sought is intended to be defined in the following claims when viewed in their proper perspective based on the prior art.

The invention claimed is:

1. A receptacle assembly, comprising:
   a receptacle formed by walls joined to form an interior cavity configured to receive an electronic module, one of the walls having an opening therethrough;
   a heat sink mounted over the opening, the heat sink having an abutment surface located adjacent the opening and the abutment surface of the heat sink being configured to physically contact the receptacle;
   a groove provided by the heat sink and the groove circumscribes the engagement surface and is recessed with respect to the a plane formed by the abutment surface; a gasket surrounding the opening and disposed in the groove so that a portion of the gasket extends outward from the groove and beyond the plane so that the gasket is disposed between the receptacle and the heat sink adjacent the abutment surface, in order to reduce leakage of radiation from the opening; and when the module is inserted an engagement surface of the heat sink rests within the interior cavity of the receptacle at a level that interferes with an installation path of the module and the heat sink is movable outward by the module when installed and the gasket expands to maintain a seal between the heat sink and the receptacle;
   a gasket surrounding the opening and disposed between the receptacle and the heat sink adjacent the abutment surface, in order to reduce leakage of radiation from the opening.

2. The receptacle assembly of claim 1, wherein the gasket mounted in the groove.

3. The receptacle assembly of claim 1, wherein the gasket is a thin rectangular shaped strand of electrically conductive elastomer.

4. The receptacle assembly of claim 1, wherein the opening is in a top wall of the receptacle and a receptacle bottom wall includes pins for mounting to a circuit board.

5. The receptacle assembly of claim 1, wherein, when the module is inserted the engagement surface of the heat sink rests within the interior cavity of the receptacle at a level that interferes "with an installation path of the module; and the heat sink having an abutment surface located proximate the receptacle and a gap formed between the abutment surface and the receptacle and the heat sink is movable outward by the module when installed and expands the width of the gap and the gasket expands to fill the gap and to maintain a seal between the heat sink and the receptacle."

6. The receptacle assembly of claim 1, wherein a bottom surface of the heat sink is stepped to extend into the interior cavity of the receptacle.

7. The receptacle assembly of claim 6, wherein the heat sink includes a perimeter surface surrounding the abutment surface, the perimeter surface being recessed with respect to the plane containing the abutment surface and the perimeter surface containing a groove for receiving the gasket.

8. The receptacle assembly of claim 1, wherein the opening is provided in a top wall and the top wall includes front, rear and opposed lateral portions that define a flat surface of the opening that support the gasket and the heat sink when mounted on the receptacle.

9. The receptacle assembly of claim 8, wherein the gasket is formed of a flexible material.

10. The receptacle assembly of claim 9, further comprising a clip provided over the heat sink, the clip securely engaging the receptacle to retain the heat sink upon the receptacle and causing the gasket to compress between the receptacle and the heat sink so that the abutment surface contacts the perimeter of the receptacle.

11. A receptacle assembly, comprising:
    a receptacle having walls joined to form an interior cavity configured to receive a pluggable module, one of the walls having an opening therethrough;
    a thermal covering component mounted over the opening, the covering component having an abutment surface located proximate the receptacle and a gap formed between the abutment surface and the receptacle;
    "a groove provided by the thermal covering component and circumscribes the engagement surface and is recessed with respect to the plane formed by the abutment surface; a gasket disposed in the gap and the gasket disposed in the groove so that a portion of the gasket extends outward from the groove and beyond the plane in order to seal the gap and prevent radiation from escaping from the opening; and when the module is inserted an engagement surface of the covering component rests within the interior cavity of the receptacle at a level that interferes with an installation path of the module and the covering component is movable outward by the module when installed and the gasket expands to maintain a seal between the covering component and the receptacle"
    a gasket disposed in the gap in order to seal the gap and prevent radiation from escaping from the opening.

12. The receptacle assembly of claim 11, wherein the opening is surrounded by front, rear and opposed lateral portions defining a flat surface and the gasket disposed around the opening upon the flat surface.

13. The receptacle assembly of claim 11, wherein the abutment surface of the covering component provides a perimeter surface including the groove for receiving the gasket.

14. The receptacle assembly of claim 13, wherein the gasket is retained within the groove with an adhesive.

15. The receptacle assembly of claim 11, further comprising a clip having a spring arm and wherein the covering component is a heat sink and the clip secured over the heat sink, the spring member flexing to permit the heat sink to move outward away from the receptacle when a pluggable module is inserted, the clip having side rails that snap over the side walls of the receptacle.

16. The receptacle assembly of claim 11, wherein the abutment surface of the covering component is flat and smooth to abut a flat surface of the receptacle.

17. The receptacle assembly of claim 11, wherein,
"when the pluggable module is installed the gasket expands to maintain a seal in the gap."

18. A heat sink for mounting to a Faraday cage, the heat sink comprising:
an upper portion for dissipating heat;
a lower portion having a planar abutment surface formed at least around an outer perimeter of the lower portion;
"the groove circumscribes the engagement surface and is recessed with respect to the a plane formed by the abutment surface; a gasket mounted in the groove so that a portion of the gasket extends outward from the groove and beyond the plane and the gasket for sealing a gap formed between the abutment surface and the Faraday cage to which the heat sink is mountable; and when the module is inserted the engagement surface of the covering heat sink rests within the interior cavity of the Faraday cage at a level that interferes with an installation path of the module and the heat sink is movable outward by the module when installed and the gasket expandable to maintain a seal between the heat sink and the receptacle."

19. The heat sink of claim 18, wherein the abutment surface forms a first flat surface for abutting a second flat surface of the Faraday cage and the gasket is interposed between the first and second surfaces.

20. The heat sink of claim 18 wherein the Faraday cage includes an opening and the gasket surrounds the opening.

* * * * *